United States Patent
Song et al.

(10) Patent No.: US 10,102,798 B2
(45) Date of Patent: Oct. 16, 2018

(54) DETECTION CIRCUIT, DETECTION METHOD AND DRIVE SYSTEM

(71) Applicant: BOE TECHNOLOGY GROUP CO., LTD., Beijing (CN)

(72) Inventors: Danna Song, Beijing (CN); Zhongyuan Wu, Beijing (CN); Junjie Lin, Beijing (CN); Cuili Gai, Beijing (CN); Lirong Wang, Beijing (CN); Chen Song, Beijing (CN); Szuheng Tseng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/022,359

(22) PCT Filed: Aug. 4, 2015

(86) PCT No.: PCT/CN2015/086004
§ 371 (c)(1),
(2) Date: Nov. 10, 2016

(87) PCT Pub. No.: WO2016/155177
PCT Pub. Date: Oct. 6, 2016

(65) Prior Publication Data
US 2017/0053590 A1    Feb. 23, 2017

(30) Foreign Application Priority Data

Apr. 3, 2015  (CN) .......................... 2015 1 0157825

(51) Int. Cl.
*G06F 3/038*    (2013.01)
*G09G 3/3225*    (2016.01)
(Continued)

(52) U.S. Cl.
CPC ....... *G09G 3/3225* (2013.01); *G01R 19/1659* (2013.01); *G09G 3/32* (2013.01);
(Continued)

(58) Field of Classification Search
CPC ................... G09G 3/3225; G09G 3/32; G09G 2300/0819; G09G 2300/0842;
(Continued)

(56) References Cited

U.S. PATENT DOCUMENTS 6,229,506 B1    5/2001  Dawson et al.
2010/0289829 A1*  11/2010  Yamamoto ........... G09G 3/3233
                                                      345/690
(Continued)

FOREIGN PATENT DOCUMENTS

CN    1551084         12/2004
CN    101859529 A     10/2010
(Continued)

OTHER PUBLICATIONS

Office Action in Chinese Application No. 201510157825.9 dated Mar. 20, 2017, with English translation. 16 pages.
(Continued)

*Primary Examiner* — Mark Regn
(74) *Attorney, Agent, or Firm* — Womble Bond Dickinson (US) LLP

(57) ABSTRACT

The disclosure provides a detection circuit, a detection method and a drive system. The detection circuit comprises a switching unit, a reset unit and a comparison unit. The switching unit is used for switching the operations of the reset unit and the comparison unit. The reset unit is used for resetting the acquisition unit before the acquisition unit begins acquisition. The comparison unit is used for com-
(Continued)

paring a signal acquired by the acquisition unit with a standard signal to obtain a characterization quantity of the to-be-detected voltage.

18 Claims, 7 Drawing Sheets

(51) Int. Cl.
  *G09G 3/32* (2016.01)
  *G01R 19/165* (2006.01)
(52) U.S. Cl.
  CPC ............... *G09G 2300/0819* (2013.01); *G09G 2300/0842* (2013.01); *G09G 2310/0251* (2013.01); *G09G 2320/0233* (2013.01); *G09G 2320/0295* (2013.01); *G09G 2320/045* (2013.01)
(58) Field of Classification Search
  CPC ... G09G 2310/0251; G09G 2320/0233; G09G 2320/0295; G09G 2320/045; G01R 19/1659
  USPC ......................................................... 345/215
  See application file for complete search history.

(56) References Cited

U.S. PATENT DOCUMENTS

| | | |
|---|---|---|
| 2013/0050292 A1 | 2/2013 | Mizukoshi |
| 2014/0347332 A1 | 11/2014 | Lee |
| 2015/0029171 A1* | 1/2015 | Jo ........................ G09G 3/3258 345/212 |

FOREIGN PATENT DOCUMENTS

| | | |
|---|---|---|
| CN | 101887688 | 11/2010 |
| CN | 102222463 A | 10/2011 |
| CN | 102473372 | 5/2012 |
| CN | 103854603 A | 6/2014 |
| CN | 103886833 | 6/2014 |
| CN | 104700761 | 6/2015 |
| KR | 20020027957 A | 4/2002 |

OTHER PUBLICATIONS

Office Action in Chinese Application No. 201510157825.9 dated Sep. 26, 2016, with English translation. 13 pages.
International Search Report and Written Opinion with English Language Translation, dated Jan. 5, 2016, Application No. PCT/CN2015/086004.
"Extended European Search Report," EP Application No. 15832678.5 (dated Aug. 22, 2018).
Kasem Khalil, "Analog to Digital Converter Architecture," VLSI Egypt, XP002783402 (Jan. 12, 2015).

* cited by examiner

DETECTION CIRCUIT, DETECTION METHOD AND DRIVE SYSTEM

TECHNICAL FIELD

The disclosure relates to the field of display technologies, and particularly to a detection circuit, a detection method and a drive system.

BACKGROUND

An active matrix organic light-emitting diode (AMOLED) display is considered as a mainstream display technology of the next generation because of its advantages of a rapid response, high brightness, high contrast, low power consumption and easy implementation of flexibility and transparency, etc. Recently, a large number of studies have been carried out to promote the large scale production of the AMOLED display.

In designing an AMOLED panel, a major problem that needs to be solved is the non-uniformity of brightness among pixels.

Firstly, a thin film transistor (TFT) is employed in the AMOLED display to construct a pixel circuit to provide an OLED device with a corresponding current. The thin film transistor is often in a form of a low temperature polycrystalline silicon thin film transistor (LTPS TFT) or an oxide thin film transistor (Oxide TFT). As compared to a common amorphous silicon thin film transistor (amorphous-Si TFT), the LTPS TFT and the Oxide TFT have a higher mobility and more stable characteristics, and are more suitable for being applied in the AMOLED display. However, due to the limitations of a crystallization process, an LTPS TFT produced on a large area glass substrate often exhibits non-uniformity in terms of electrical parameters such as the threshold voltage, mobility, and such non-uniformity will be converted to a current difference and brightness difference of the OLED device, and thus perceived by human eyes (namely, a mura phenomenon). The uniformity of the process of the Oxide TFT is better. But similarly to the a-Si TFT, after being under a pressure and high temperature for a long time, the Oxide TFT will experience a drift of the threshold voltage. In displaying different images, the amounts of threshold voltage drift of the TFTs of individual parts of the panel are different, which will result in a display brightness difference. Since such a difference is related with an image displayed previously, it often leads to rendition of artifacts.

Secondly, when the OLED device is in evaporation, non-uniformity in thickness of the film will also cause the non-uniformity of the electrical performance. For an a-Si TFT or Oxide TFT process in which an N-type thin film transistor (N-Type TFT) is employed to construct a pixel cell, a storage capacitor is connected between a gate of the drive TFT and the OLED anode. Thus, when a data voltage is transmitted to the gate, if the voltages of the OLED anodes of individual pixels are different, the gate-source voltages (Vgs) actually loaded onto the TFTs will be different, and thereby the drive current will be different, causing a difference in the brightness of the pixels of the OLED display.

Studies show that, the main reasons that cause a difference in display brightness of the AMOLED panel lie in that the threshold voltages of OLED drive transistors in different pixel cells are different due to the drift, and that the working voltages of OLED devices in different pixel cells are different due to non-uniform film thicknesses of the OLED devices in evaporation.

To solve the problem of a display brightness difference in the AMOLED panel, in general, the threshold voltage of the drive transistor and the working voltage of the OLED device will be compensated by way of an internal compensation or external compensation. However, before the compensation, it is needed to detect the threshold voltage of the drive transistor and the working voltage of the OLED device first. How to detect the threshold voltage of the drive transistor and the working voltage of the OLED device in an AMOLED panel has become an urgent problem to be solved.

SUMMARY

In view of the above technical problem existing in the prior art, the disclosure provides a detection circuit, a detection method and a drive system. The detection circuit can detect a representative quantity of the threshold voltage of a drive transistor and/or the working voltage of a light emitting element in a pixel circuit, and thereby can detect non-uniformity of display brightness of pixels inside an active matrix organic electroluminescence display device. In turn, an external compensation circuit is enabled to well compensate the display brightness of pixels based on the detection, such that the uniformity of display and hence the display effect of the active matrix organic electroluminescence display device will be improved.

According to a first aspect of the disclosure, a detection circuit is provided for detecting a representative quantity of a threshold voltage of a drive transistor or a working voltage of a light emitting element in a pixel circuit. The pixel circuit comprises an acquisition unit connected with the drive transistor and the light emitting element and configured to acquire a to-be-detected voltage. The to-be-detected voltage is the representative quantity of the threshold voltage of the drive transistor or the working voltage of the light emitting element. The detection circuit comprises: a reset unit for resetting the acquisition unit before the acquisition unit begins acquisition; a comparison unit for comparing a signal acquired by the acquisition unit with a standard signal to obtain a characterization quantity of the to-be-detected voltage; and a switching unit for switching operations of the reset unit and the comparison unit. The reset unit and the comparison unit are connected with the switching unit and the switching unit is connected with the acquisition unit.

In an implementation, the acquisition unit comprises a first transistor and an acquisition line. A first electrode of the first transistor is connected with a first electrode of the drive transistor and a first electrode of the light emitting element, and the first electrode of the drive transistor is connected with the first electrode of the light emitting element. A second electrode of the first transistor is connected with the acquisition line, and a gate of the first transistor is connected with a first control line. The acquisition line is configured to acquire the to-be-detected voltage under control of the first transistor.

In an implementation, the switching unit is connected with the acquisition line, and the switching unit comprises a second transistor, a third transistor, a fourth transistor, a fifth transistor, a sixth transistor and a seventh transistor. A first electrode of the second transistor and a first electrode of the fourth transistor are connected with the acquisition line. A second electrode of the second transistor, a first electrode of the third transistor and a first electrode of the seventh transistor are connected with the comparison unit. A second electrode of the third transistor is connected with the comparison unit. A second electrode of the fourth transistor and a first electrode of the fifth transistor are connected with the comparison unit. A second electrode of the fifth transistor is connected with the reset unit. A first electrode of the sixth transistor and a second electrode of the seventh transistor are connected with the comparison unit. A second electrode of the sixth transistor is connected with the comparison unit.

In an implementation, the reset unit comprises an eighth transistor and a ninth transistor. A first electrode of the eighth transistor and a first electrode of the ninth transistor are connected with the second electrode of the fifth transistor. A second electrode of the eighth transistor is connected with a first signal line. A second electrode of the ninth transistor is connected with a second signal line.

In an implementation, the second transistor, the fifth transistor, the seventh transistor and the ninth transistor are N-type transistors, and the third transistor, the fourth transistor, the sixth transistor and the eighth transistor are P-type transistors. Alternatively the second transistor, the fifth transistor, the seventh transistor and the ninth transistor are P-type transistors, and the third transistor, the fourth transistor, the sixth transistor and the eighth transistor are N-type transistors.

In an implementation, gates of the second transistor, the third transistor, the fourth transistor, the fifth transistor, the sixth transistor and the seventh transistor are connected with a second control line, and gates of the eighth transistor and the ninth transistor are connected with a third control line.

In an implementation, the comparison unit comprises a comparison amplifier, a ramp voltage generator module and an output module. A first input terminal of the comparison amplifier is connected with the second electrode of the fourth transistor and the first electrode of the fifth transistor. A second input terminal of the comparison amplifier is connected with the first electrode of the sixth transistor and the second electrode of the seventh transistor. An output terminal of the comparison amplifier is connected with the second electrode of the second transistor, the first electrode of the third transistor and the first electrode of the seventh transistor. An output terminal of the ramp voltage generator module is connected with the second electrode of the sixth transistor. An input terminal of the ramp voltage generator module is connected with a third signal line. An input terminal of the output module is connected with the second electrode of the third transistor. The ramp voltage generator module is configured to generate and output the standard signal, which is a ramp voltage signal. The comparison amplifier is configured to compare the to-be-detected voltage acquired by the acquisition line with the ramp voltage outputted by the ramp voltage generator module and output a comparison result. An output terminal of the output module is configured to output a detection result of the detection circuit according to the comparison result of the comparison amplifier.

In an implementation, the ramp voltage generator module comprises a first amplifier, a second amplifier, a current source, a first capacitor and a control switch. A positive input terminal of the first amplifier is connected with the third signal line. A negative input terminal of the first amplifier, an output terminal of the first amplifier and a first terminal of the control switch are connected with a first terminal of the first capacitor. A positive input terminal of the second amplifier, a second terminal of the first capacitor and a second terminal of the control switch are connected with an output terminal of the current source. A negative input terminal of the second amplifier is connected with an output terminal of the second amplifier. The output terminal of the second amplifier is connected with the second electrode of the sixth transistor.

In an implementation, the ramp voltage generator module further comprises a calibration voltage source. An anode of the calibration voltage source is connected with the positive input terminal of the second amplifier. A cathode of the calibration voltage source is connected with the negative input terminal of the second amplifier. The calibration voltage source is configured to calibrate a voltage deviation between the positive input terminal and the negative input terminal of the first amplifier and a voltage deviation between the positive input terminal and the negative input terminal of the second amplifier.

In an implementation, the output module comprises a logic controller and a counter. An input terminal of the logic controller is connected with the second electrode of the third transistor. A control terminal of the logic controller is connected with the counter. The logic controller is configured to, according to the comparison result outputted by the comparison amplifier, record a corresponding count value of the counter upon a change of the comparison result, and to output the count value. The count value characterizes the to-be-detected voltage.

In an implementation, the detection circuit further comprises a capacitance calibration unit for calibrating a line capacitance of the acquisition line. The capacitance calibration unit comprises a tenth transistor, an eleventh transistor, a twelfth transistor and a calibration capacitor. A first electrode of the tenth transistor and a first electrode of the eleventh transistor are connected with the acquisition line. A second electrode of the tenth transistor and a first terminal of the calibration capacitor are connected with a first electrode of the twelfth transistor. A second terminal of the calibration capacitor is grounded. A gate of the tenth transistor is connected with a fourth control line. A second electrode of the eleventh transistor and the first electrode of the second transistor are connected with the first electrode of the fourth transistor. A gate of the eleventh transistor is connected with a fifth control line. A second electrode of the twelfth transistor is connected with the second signal line. A gate of the twelfth transistor is connected with a sixth control line.

In an implementation, the detection circuit further comprises a de-noising unit for eliminating interference of an external noise to the to-be-detected voltage acquired by the acquisition line. The de-noising unit comprises a de-noising capacitor. A first terminal of the de-noising capacitor is connected with the first electrode of the tenth transistor, the first electrode of the eleventh transistor and the acquisition line. A second terminal of the de-noising capacitor is grounded.

According to a second aspect of the disclosure, a method is further provided for using a detection circuit to detect a representative quantity of a threshold voltage of a drive transistor or a working voltage of a light emitting element in a pixel circuit. The pixel circuit comprises an acquisition unit connected with the drive transistor and the light emitting element. The detection circuit comprises a switching unit, a reset unit and a comparison unit. The reset unit and the comparison unit are connected with the switching unit, and the switching unit is connected with the acquisition unit. The method comprises: at step S11, causing the reset unit to operate by switching the switching unit; at step S12, resetting, by the reset unit, the acquisition unit before the acquisition unit begins acquisition; at step S13, acquiring, by the acquisition unit, a to-be-detected voltage, which is the representative quantity of the threshold voltage of the drive transistor or the working voltage of the light emitting element; at step S14, causing the comparison unit to operate by switching the switching unit; and at step S15, comparing, by the comparison unit, a signal acquired by the acquisition unit with a standard signal to obtain a characterization quantity of the to-be-detected voltage.

In an implementation, the acquisition unit comprises a first transistor and an acquisition line. A first electrode of the first transistor is connected with a first electrode of the drive transistor and a first electrode of the light emitting element. The first electrode of the drive transistor is connected with the first electrode of the light emitting element. A second electrode of the first transistor is connected with the acquisition line. A gate of the first transistor is connected with a first control line. The acquisition line is configured to acquire the to-be-detected voltage under control of the first transistor. The switching unit is connected with the acquisition line, and the switching unit comprises a second transistor, a third transistor, a fourth transistor, a fifth transistor, a sixth transistor and a seventh transistor. A first electrode of the second transistor and a first electrode of the fourth transistor are connected with the acquisition line. A second electrode of the second transistor, a first electrode of the third transistor and a first electrode of the seventh transistor are connected with the comparison unit. A second electrode of the third transistor is connected with the comparison unit. A second electrode of the fourth transistor and a first electrode of the fifth transistor are connected with the comparison unit. A second electrode of the fifth transistor is connected with the reset unit. A first electrode of the sixth transistor and a second electrode of the seventh transistor are connected with the comparison unit. A second electrode of the sixth transistor is connected with the comparison unit. The second transistor, the fifth transistor and the seventh transistor are N-type transistors, and the third transistor, the fourth transistor and the sixth transistor are P-type transistors. Alternatively, the second transistor, the fifth transistor and the seventh transistor are P-type transistors, and the third transistor, the fourth transistor and the sixth transistor are N-type transistors. Gates of the second transistor, the third transistor, the fourth transistor, the fifth transistor, the sixth transistor and the seventh transistor are connected with a second control line. The step S11 comprises: inputting, via the second control line, a control signal to turn on the second transistor, the fifth transistor and the seventh transistor, and at the same time to turn off the third transistor, the fourth transistor and the sixth transistor.

In an implementation, the reset unit comprises an eighth transistor and a ninth transistor. A first electrode of the eighth transistor and a first electrode of the ninth transistor are connected with the second electrode of the fifth transistor. A second electrode of the eighth transistor is connected with a first signal line. A second electrode of the ninth transistor is connected with a second signal line. The ninth transistor is an N-type transistor, and the eighth transistor is a P-type transistor. Alternatively, the ninth transistor is a P-type transistor, and the eighth transistor is an N-type transistor. Gates of the eighth transistor and the ninth transistor are connected with a third control line. When the representative quantity of the threshold voltage of the drive transistor is to be detected, the step S12 comprises: inputting, via the third control line, a control signal to turn on the eighth transistor and at the same time to turn off the ninth transistor; inputting, via the first signal line, a low voltage signal to reset a signal on the acquisition line to the low voltage signal. When the working voltage of the light emitting element is to be detected, the step S12 comprises: inputting, via the third control line, a control signal to turn on the ninth transistor and at the same time to turn off the eighth transistor; and inputting, via the second signal line, a high voltage signal to reset a signal on the acquisition line to the high voltage signal.

In an implementation, the pixel circuit further comprises a thirteenth transistor and a storage capacitor. A first electrode of the thirteenth transistor is connected with a data line. A second electrode of the thirteenth transistor is connected with a first terminal of the storage capacitor and a gate of the drive transistor. A gate of the thirteenth transistor is connected with a scan control line. The first electrode of the drive transistor is connected with a first power supply. A second electrode of the light emitting element is connected with a second power supply. A second terminal of the storage capacitor is connected with the second electrode of the drive transistor, the first electrode of the light emitting element and the first electrode of the first transistor. The second electrode of the first transistor is connected with the acquisition line. The gate of the first transistor is connected with the first control line. When the representative quantity of the threshold voltage of the drive transistor is to be detected, the step S13 comprises: at step S130, inputting, via the scan control line, a control signal to turn on the thirteenth transistor, such that a first voltage signal is written via the data line to cause a voltage difference across the storage capacitor to be greater than the threshold voltage of the drive transistor; at step S131, inputting, via the scan control line, a control signal to turn off the thirteenth transistor, and controlling, by the first control line, the first transistor to be turned on to cause charging of a line capacitance of the acquisition line by a current of the drive transistor; and at step S132, in response to the charging being conducted to a point where a gate-source voltage of the drive transistor is the threshold voltage of the drive transistor, turning on the thirteenth transistor, such that a second voltage signal is written via the data line to turn off the drive transistor. When the working voltage of the light emitting element is to be detected, the step S13 comprises: at step S130', inputting, via the scan control line, a control signal to turn on the thirteenth transistor, such that the second voltage signal is written via the data line to turn off the drive transistor; at step 131', controlling, by the first control line, the first transistor to be turned on to cause discharging of charges stored on the acquisition line via the light emitting element; and at step S132', in response to the discharging being conducted to a point where a voltage on the acquisition line is the working voltage of the light emitting element, turning off the first transistor.

In an implementation, the step S14 comprises: inputting, via the second control line, a control signal to turn on the third transistor, the fourth transistor and the sixth transistor, and at the same time to turn off the second transistor, the fifth transistor and the seventh transistor.

In an implementation, the comparison unit comprises a comparison amplifier, a ramp voltage generator module and an output module. A first input terminal of the comparison amplifier is connected with the second electrode of the fourth transistor and the first electrode of the fifth transistor. A second input terminal of the comparison amplifier is connected with the first electrode of the sixth transistor and the second electrode of the seventh transistor. An output terminal of the comparison amplifier is connected with the second electrode of the second transistor, the first electrode of the third transistor and the first electrode of the seventh transistor. An output terminal of the ramp voltage generator module is connected with the second electrode of the sixth transistor. An input terminal of the ramp voltage generator module is connected with a third signal line. An input terminal of the output module is connected with the second electrode of the third transistor. The output module comprises a logic controller and a counter. An input terminal of the logic controller is connected with the second electrode of the third transistor, and a control terminal of the logic controller is connected with the counter. When the representative quantity of the threshold voltage of the drive transistor is to be detected, the step S15 comprises: at step S150, generating and outputting, by the ramp voltage generator module, the standard signal, the standard signal being a ramp voltage signal, and comparing, by the comparison amplifier, the representative quantity of the threshold voltage of the drive transistor on the acquisition line with the ramp voltage outputted by the ramp voltage generator module and outputting a comparison result; and at step S151, upon a change of the comparison result outputted by the comparison amplifier, recording, by the logic controller, a corresponding count value of the counter upon the change of the comparison result, and outputting the count value, the count value characterizing the representative quantity of the threshold voltage of the drive transistor. When the working voltage of the light emitting element is to be detected, the step S15 comprises: at step S150', generating and outputting, by the ramp voltage generator module, the standard signal, the standard signal being a ramp voltage signal, and comparing, by the comparison amplifier, the working voltage of the light emitting element on the acquisition line with the ramp voltage outputted by the ramp voltage generator module and outputting a comparison result; and at step S151', upon a change of the comparison result outputted by the comparison amplifier, recording, by the logic controller, a corresponding count value of the counter upon the change of the comparison result, and outputting the count value, the count value characterizing the working voltage of the light emitting element.

In an implementation, the detection circuit further comprises a capacitance calibration unit. The capacitance calibration unit comprises a tenth transistor, an eleventh transistor, a twelfth transistor and a calibration capacitor. A first electrode of the tenth transistor and a first electrode of the eleventh transistor are connected with the acquisition line. A second electrode of the tenth transistor and a first terminal of the calibration capacitor are connected with a first electrode of the twelfth transistor. A second terminal of the calibration capacitor is grounded. A gate of the tenth transistor is connected with a fourth control line. A second electrode of the eleventh transistor and the first electrode of the second transistor are connected with the first electrode of the fourth transistor. A gate of the eleventh transistor is connected with a fifth control line. A second electrode of the twelfth transistor is connected with the second signal line. A gate of the twelfth transistor is connected with a sixth control line. The method further comprises step S10 of calibrating the line capacitance of the acquisition line prior to the step 11. The step S10 comprises: at step S100, inputting, via the fifth control line, a control signal to turn on the eleventh transistor, inputting, via the second control line, a control signal to turn on the second transistor, the fifth transistor and the seventh transistor, inputting, via the third control line, a control signal to turn on the eighth transistor, inputting, via the first signal line, a low voltage signal to reset a signal on the acquisition line to the low voltage signal; at the same time, inputting, via the sixth control line, a control signal to turn on the twelfth transistor, inputting, via the second signal line, a high voltage signal to reset a signal on the calibration capacitor to the high voltage signal; and at step S101, turning off the eleventh transistor and the twelfth transistor, inputting, via the fourth control line, a control signal to turn on the tenth transistor, and sharing, by the calibration capacitor, charges with the line capacitance of the acquisition line.

In an implementation, the ramp voltage generator module comprises a first amplifier, a second amplifier, a current source, a first capacitor and a control switch. A positive input terminal of the first amplifier is connected with the third signal line. A negative input terminal of the first amplifier, an output terminal of the first amplifier and a first terminal of the control switch are connected with a first terminal of the first capacitor. A positive input terminal of the second amplifier, a second terminal of the first capacitor and a second terminal of the control switch are connected with an output terminal of the current source. When the second amplifier operates as an amplifier, a negative input terminal of the second amplifier is connected with an output terminal of the second amplifier. When the second amplifier operates as a comparator, the negative input terminal of the second amplifier is connected with the positive input terminal of the first amplifier. The output terminal of the second amplifier is connected with the second electrode of the sixth transistor. The ramp voltage generator module further comprises a calibration voltage source. An anode of the calibration voltage source is connected with the positive input terminal of the second amplifier. A cathode of the calibration voltage source is connected with the negative input terminal of the second amplifier. The method further comprises: prior to the step S10, calibrating a voltage deviation between the positive input terminal and the negative input terminal of each of the first amplifier and the second amplifier in the ramp voltage generator module, comprising: causing the second amplifier to operate as a comparator; closing the control switch, such that the current source does not charge the first capacitor; inputting, via the third signal line, a third voltage signal; and automatically calibrating the voltage deviation between the positive input terminal and the negative input terminal of each of the first amplifier and the second amplifier by changing a voltage value of the calibration voltage source until an output voltage of the second amplifier changes from a high voltage to a low voltage or from a low voltage to a high voltage.

According to a third aspect of the disclosure, a drive system is further provided for driving a pixel circuit, comprising a detection circuit as described above.

In an implementation, the drive system further comprises a drive circuit. The drive circuit comprises: a latch for latching display data; a line storage connected to the latch and configured to receive display data from the latch and store display data for a row of pixel cells; a digital-to-analog converter connected to the line storage and configured to convert corresponding display data in the line storage to an analog voltage signal; and a third amplifier for supplying the analog voltage signal converted by the digital-to-analog converter to a data line of a corresponding pixel cell. A positive input terminal of the third amplifier is connected with an output terminal of the digital-to-analog converter, and a negative input terminal of the third amplifier is connected with an output terminal of the third amplifier and the data line.

The beneficial effects of the disclosure lie in that by being provided with a switching unit, a reset unit and a comparison unit, the detection circuit provided by the disclosure can detect a representative quantity of a to-be-detected threshold voltage of a drive transistor or a to-be-detected working voltage of a light emitting element in a pixel circuit, and thereby can detect non-uniformity of display brightness of pixels inside an active matrix organic electroluminescence display device. In turn, an external compensation circuit is enabled to well compensate the display brightness of pixels according to the detection result, such that the uniformity of display and hence the display effect of the active matrix organic electroluminescence display device will be improved.

For the drive system provided by the disclosure, by employing the above described detection circuit, it can not only drive a pixel circuit, but also detect non-uniformity of display brightness of pixels inside an active matrix organic electroluminescence display device. In turn, an external compensation circuit is enabled to well compensate the display brightness of pixels according to the detection result, such that the uniformity of display and hence the display effect of the active matrix organic electroluminescence display device will be improved.

LISTING OF REFERENCE NUMERALS

1 Acquisition unit
2 Switching unit
3 Reset unit
4 Comparison unit.

DETAILED DESCRIPTION

A detection circuit and a detection method thereof, and a drive system provided by the disclosure will be further described below in connection with the drawings and specific embodiments, in order to enable the skilled in the art to better understand the technical solutions of the disclosure.

First Embodiment

Figure 1:
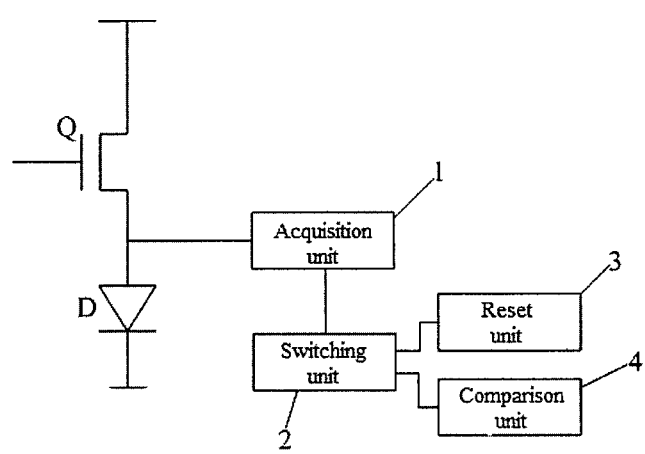
FIG. 1 is a circuit schematic diagram of a detection circuit in the disclosure.

The embodiment provides a detection circuit for detecting a representative quantity of a threshold voltage of a drive transistor and a working voltage of a light emitting element in a pixel circuit. As shown in FIG. 1, the pixel circuit comprises an acquisition unit 1 which is connected with a drive transistor Q and a light emitting element D and used for acquiring a to-be-detected voltage (i.e., the representative quantity of the threshold voltage of the drive transistor Q or the working voltage of the light emitting element D). The detection circuit comprises a switching unit 2, a reset unit 3 and a comparison unit 4. The reset unit 3 and the comparison unit 4 are connected with the switching unit 2.

The switching unit 2 is connected with the acquisition unit 1. The switching unit 2 is used for switching the operations of the reset unit 3 and the comparison unit 4. The reset unit 3 is used for resetting the acquisition unit 1 before the acquisition unit 1 begins acquisition. The comparison unit 4 is used for comparing a signal acquired by the acquisition unit 1 with a standard signal to obtain a characterization quantity of the to-be-detected voltage (i.e., the representative quantity of the threshold voltage of the drive transistor Q or the working voltage of the light emitting element D).

By being provided with the switching unit 2, the reset unit 3 and the comparison unit 4, the detection circuit can detect the representative quantity of the threshold voltage of the drive transistor Q and the working voltage of the light emitting element D in the pixel circuit, and thereby can detect non-uniformity of display brightness of pixels inside an active matrix organic electroluminescence display device. In turn, an external compensation circuit is enabled to well compensate the display brightness of pixels according to the detection result, such that the uniformity of display and hence the display effect of the active matrix organic electroluminescence display device is improved.

Figure 2:
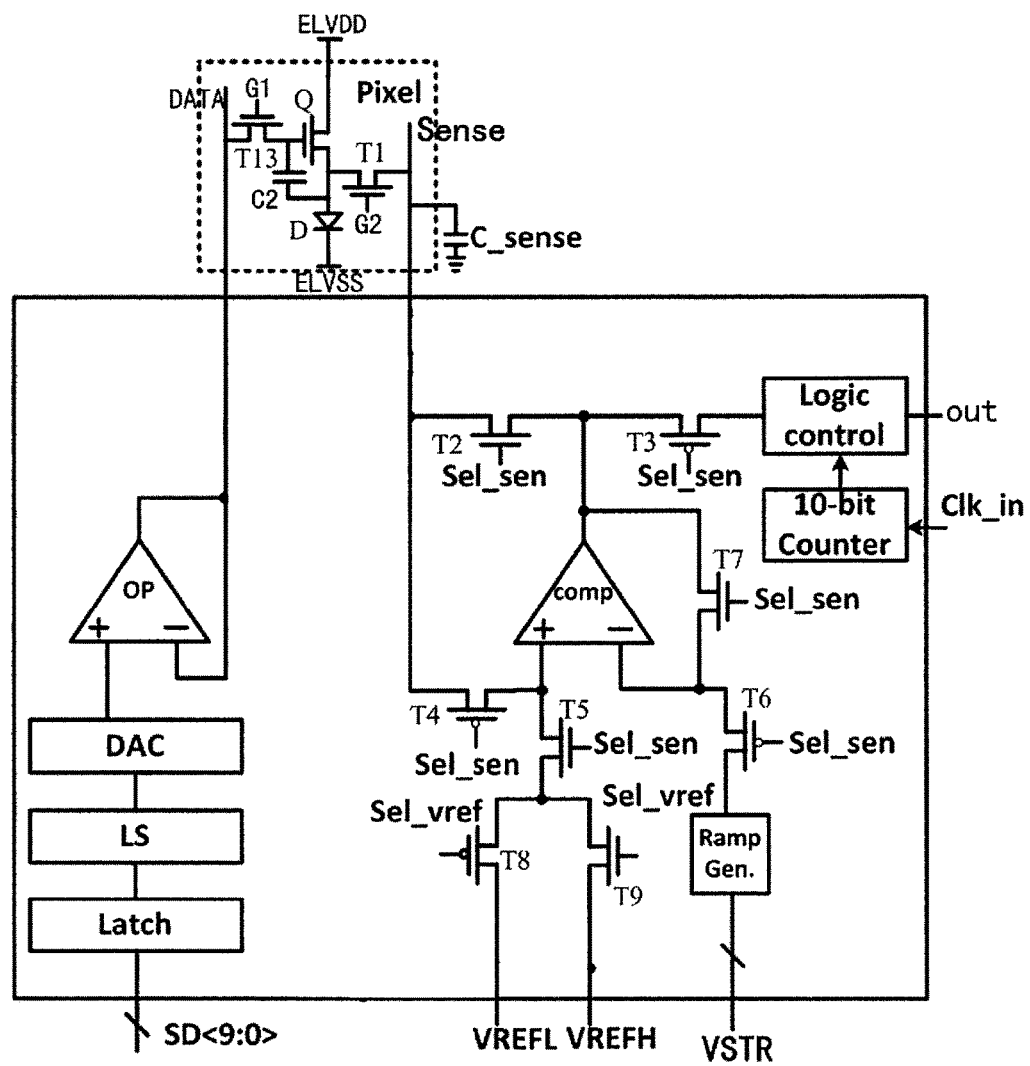
FIG. 2 is a circuit diagram of a detection circuit corresponding to the circuit schematic diagram of FIG. 1 in a first embodiment of the disclosure.

In this embodiment, as shown in FIG. 2, the acquisition unit comprises a first transistor T1 and an acquisition line Sense. A first electrode of the first transistor T1 is connected with a first electrode of the drive transistor Q and a first electrode of the light emitting element D, and the first electrode of the drive transistor Q is connected with the first electrode of the light emitting element D. A second electrode of the first transistor T1 is connected with the acquisition line Sense, and a gate of the first transistor T1 is connected with a first control line G2. The acquisition line Sense is configured to acquire the to-be-detected voltage (i.e., the representative quantity of the threshold voltage of the drive transistor Q or the working voltage of the light emitting element D) under control of the first transistor T1.

The first electrode of the light emitting element D is an anode, and the second electrode of the light emitting element D is a cathode.

The switching unit is connected with the acquisition line Sense, and the switching unit comprises a second transistor T2, a third transistor T3, a fourth transistor T4, a fifth transistor T5, a sixth transistor T6 and a seventh transistor T7. A first electrode of the second transistor T2 and a first electrode of the fourth transistor T4 are connected with the acquisition line Sense. A second electrode of the second transistor T2, a first electrode of the third transistor T3 and a first electrode of the seventh transistor T7 are connected with the comparison unit. A second electrode of the third transistor T3 is connected with the comparison unit. A second electrode of the fourth transistor T4 and a first electrode of the fifth transistor T5 are connected with the comparison unit. A second electrode of the fifth transistor T5 is connected with the reset unit. A first electrode of the sixth transistor T6 and a second electrode of the seventh transistor T7 are connected with the comparison unit. A second electrode of the sixth transistor T6 is connected with the comparison unit.

The reset unit comprises an eighth transistor T8 and a ninth transistor T9. A first electrode of the eighth transistor T8 and a first electrode of the ninth transistor T9 are connected with the second electrode of the fifth transistor T5. A second electrode of the eighth transistor T8 is connected with a first signal line VREFL. A second electrode of the ninth transistor T9 is connected with a second signal line VREFH.

In this embodiment, the second transistor T2, the fifth transistor T5, the seventh transistor T7 and the ninth transistor T9 are N-type transistors, and the third transistor T3, the fourth transistor T4, the sixth transistor T6 and the eighth transistor T8 are P-type transistors.

It is to be noted that the second transistor T2, the fifth transistor T5, the seventh transistor T7 and the ninth transistor T9 may also be P-type transistors, and that the third transistor T3, the fourth transistor T4, the sixth transistor T6 and the eighth transistor T8 may be N-type transistors. This way, the switching unit only needs one control line to achieve switching control of the reset unit and the comparison unit, such that the detection circuit is simpler in wiring and is more convenient to control.

In this embodiment, gates of the second transistor T2, the third transistor T3, the fourth transistor T4, the fifth transistor T5, the sixth transistor T6 and the seventh transistor T7 are connected with a second control line Sel_sen. Gates of the eighth transistor T8 and the ninth transistor T9 are connected with a third control line Sel_vref.

It is to be noted that the gate of each of the second transistor T2, the third transistor T3, the fourth transistor T4, the fifth transistor T5, the sixth transistor T6 and the seventh transistor T7 may also be connected with a respective control line. Alternatively, two or more of the second transistor T2, the third transistor T3, the fourth transistor T4, the fifth transistor T5, the sixth transistor T6 and the seventh transistor T7 are connected with a single control line, and the others are connected with another control line ---- as long as the switching unit can accomplish the switching of the reset unit and the comparison unit under control of the control line.

In this embodiment, the comparison unit comprises a comparison amplifier comp, a ramp voltage generator module denotes as "Ramp Gen" and an output module. A first input terminal of the comparison amplifier comp is connected with the second electrode of the fourth transistor T4 and the first electrode of the fifth transistor T5. A second input terminal of the comparison amplifier comp is connected with the first electrode of the sixth transistor T6 and the second electrode of the seventh transistor T7. An output terminal of the comparison amplifier comp is connected with the second electrode of the second transistor T2, the first electrode of the third transistor T3 and the first electrode of the seventh transistor T7. An output terminal of the ramp voltage generator module is connected with the second electrode of the sixth transistor T6. An input terminal of the ramp voltage generator module is connected with a third signal line VSTR. An input terminal of the output module is connected with the second electrode of the third transistor T3. The ramp voltage generator module is used for generating and outputting the standard signal, which is a ramp voltage signal. The comparison amplifier comp is used for comparing the to-be-detected voltage (i.e., the representative quantity of the threshold voltage of the drive transistor Q or the working voltage of the light emitting element D) acquired by the acquisition line Sense with the ramp voltage outputted by the ramp voltage generator module and outputting a comparison result. An output terminal out of the output module is configured to output a detection result of the detection circuit according to the comparison result of the comparison amplifier comp.

In this embodiment, the first input terminal of the comparison amplifier comp is a positive input terminal of the comparison amplifier comp, and the second input terminal of the comparison amplifier comp is a negative input terminal of the comparison amplifier comp.

It is to be noted that the first input terminal of the comparison amplifier comp may also be the negative input terminal of the comparison amplifier comp, and that the second input terminal of the comparison amplifier comp may also be the positive input terminal of the comparison amplifier comp.

In this embodiment, the output module comprises a logic controller denoted as "Logic control" and a counter denoted as "Counter". An input terminal of the logic controller is connected with the second electrode of the third transistor T3. A control terminal of the logic controller is connected with the counter. The logic controller is used for, according to the comparison result outputted by the comparison amplifier comp, recording a corresponding count value of the counter upon a change of the comparison result, and outputting the count value. The count value characterizes the to-be-detected voltage (i.e., the representative quantity of the threshold voltage of the drive transistor Q or the working voltage of the light emitting element D).

Figure 3:
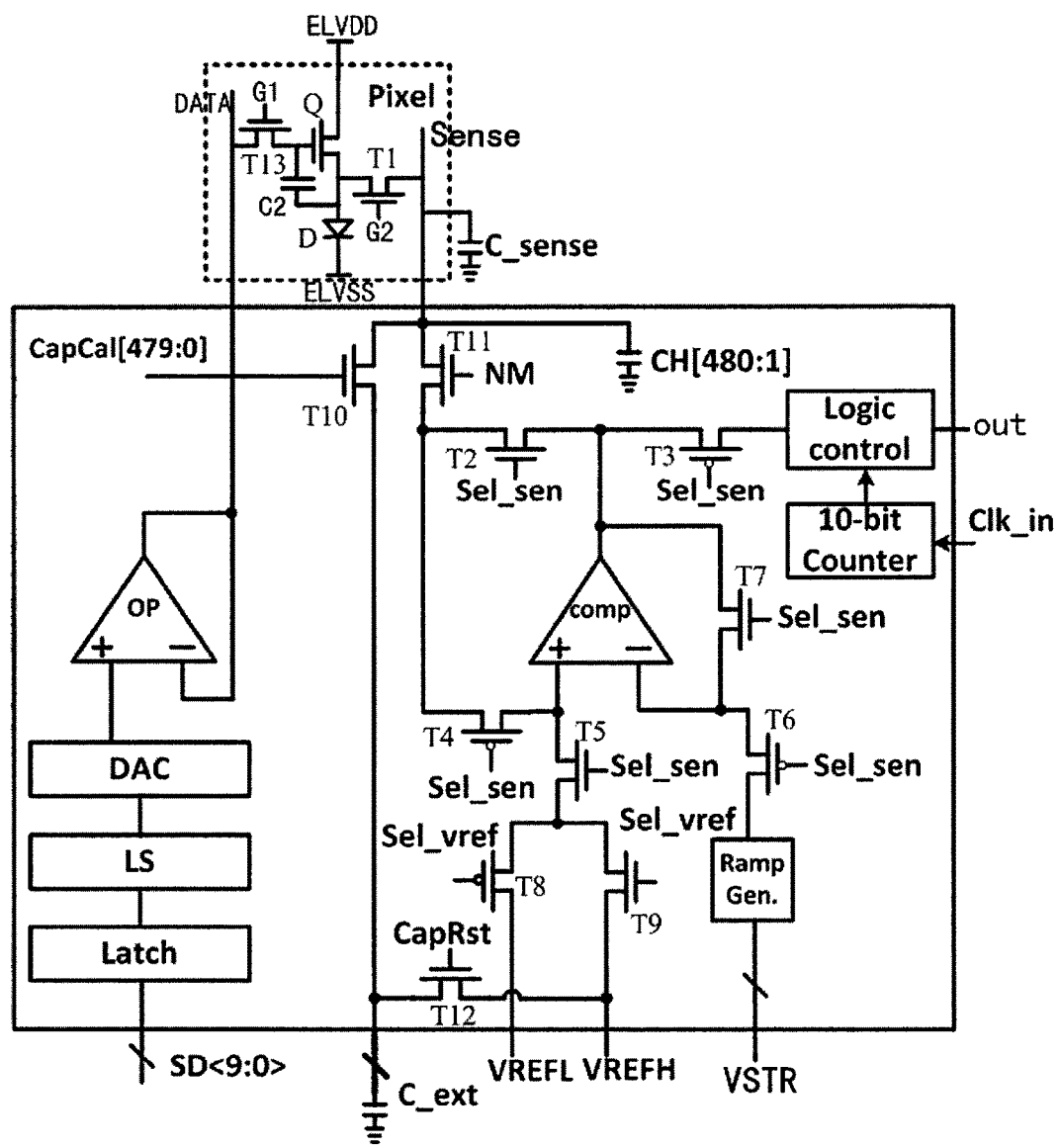
FIG. 3 is an overall circuit diagram of the detection circuit in a first embodiment of the disclosure.

In this embodiment, as shown in FIG. 3, the detection circuit further comprises a capacitance calibration unit for calibrating a line capacitance C_sense of the acquisition line Sense. The capacitance calibration unit comprises a tenth transistor T10, an eleventh transistor T11, a twelfth transistor T12 and a calibration capacitor C_ext. A first electrode of the tenth transistor T10 and a first electrode of the eleventh transistor T11 are connected with the acquisition line Sense. A second electrode of the tenth transistor T10 and a first electrode of the calibration capacitor C_ext are connected with a first electrode of the twelfth transistor T12. A second terminal of the calibration capacitor C_ext is grounded. A gate of the tenth transistor T10 is connected with a fourth control line CapCal. A second electrode of the eleventh transistor T11 and the first electrode of the second transistor T2 are connected with the first electrode of the fourth transistor T4. A gate of the eleventh transistor T11 is connected with a fifth control line NM. A second electrode of the twelfth transistor T12 is connected with the second signal line VREFH. A gate of the twelfth transistor T12 is connected with a sixth control line CapRst.

The arrangement of the capacitance calibration unit enables calibration of the line capacitance C_sense of the acquisition line Sense before the detection of the detection circuit, thereby enabling the detection result of the detection circuit to be more accurate.

In this embodiment, the detection circuit further comprises a de-noising unit for eliminating interference of an external noise to the to-be-detected voltage (i.e., the representative quantity of the threshold voltage of the drive transistor Q or the working voltage of the light emitting element D) acquired by the acquisition line Sense. The de-noising unit comprises a de-noising capacitor CH. A first terminal of the de-noising capacitor is connected with the first electrode of the tenth transistor T10, the first electrode of the eleventh transistor T11 and the acquisition line Sense. A second terminal of the de-noising capacitor CH is grounded.

The arrangement of the de-noising unit enables elimination of interference of an external noise to the to-be-detected voltage (i.e., the representative quantity of the threshold voltage of the drive transistor Q or the working voltage of the light emitting element D) acquired by the acquisition line Sense, thereby enabling the detection result of the detection circuit to be more accurate.

Figure 4:
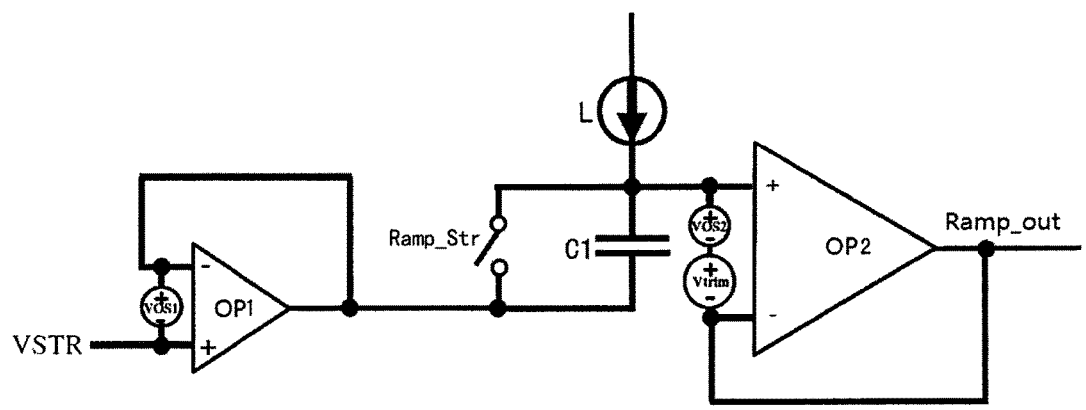
FIG. 4 is a circuit diagram of a ramp voltage generator module in FIG. 2.

In this embodiment, as shown in FIG. 4, the ramp voltage generator module comprises a first amplifier OP1, a second amplifier OP2, a current source L, a first capacitor C1 and a control switch Ramp_Str. A positive input terminal of the first amplifier OP1 is connected with the third signal line VSTR. A negative input terminal of the first amplifier OP1, an output terminal of the first amplifier OP1 and a first terminal of the control switch Ramp_Str are connected with a first terminal of the first capacitor C1. A positive input terminal of the second amplifier OP2, a second terminal of the first capacitor C1 and a second terminal of the control switch Ramp_Str are connected with an output terminal of the current source L. In a normal operation of the ramp voltage generator module, the second amplifier OP2 operates as an amplifier, and a negative input terminal of the second amplifier OP2 is connected with an output terminal of the second amplifier OP2. In a calibration operation (discussed below), the second amplifier OP2 operates as a comparator. The negative input terminal of the second amplifier OP2 is connected with the positive input terminal of the first amplifier OP1, and the output terminal of the second amplifier OP2 is connected with the second electrode of the sixth transistor T6. That is, the output terminal Ramp_out of the second amplifier OP2 is the output terminal of the ramp voltage generator module.

In this embodiment, the ramp voltage generator module further comprises a calibration voltage source Vtrim. An anode of the calibration voltage source Vtrim is connected with the positive input terminal of the second amplifier OP2. A cathode of the calibration voltage source Vtrim is connected with the negative input terminal of the second amplifier OP2. The calibration voltage source Vtrim is used for calibrating a voltage deviation VOS1 between the positive input terminal and the negative input terminal of the first amplifier OP1 and a voltage deviation VOS2 between the positive input terminal and the negative input terminal of the second amplifier OP2.

The arrangement of the calibration voltage source Vtrim enables calibration of voltage deviations between respective positive and negative imputer terminals of the two stage amplifiers in the ramp voltage generator module (discussed below), resulting in a more accurate ramp voltage signal (i.e., the standard signal) that is generated and outputted by the ramp voltage generator module. In turn, the comparison result outputted by the comparison amplifier comp after a comparison operation may be more accurate. Namely, the accuracy of the detection result of the overall detection circuit is improved.

It is to be noted that the detection circuit may detect either the representative quantity of the threshold voltage of the drive transistor Q or the working voltage of the light emitting element D.

It is further to be noted that, in this embodiment, the drive transistor Q, the first transistor T1, the second transistor T2, the third transistor T3, the fourth transistor T4, the fifth transistor T5, the sixth transistor T6, the seventh transistor T7, the eighth transistor T8, the ninth transistor T9, the tenth transistor T10, the eleventh transistor T11 and the twelfth transistor T12 are thin film transistors. However, other type of switch transistor having a gating switch function is possible. When the gate of a thin film transistor is turned on, it is conductive between the first electrode and the second electrode. When a voltage of the first electrode of the thin film transistor is high, a current flows from the first electrode to the second electrode. When a voltage of the second electrode of the thin film transistor is high, a current flows from the second electrode to the first electrode. Therefore, when the first electrode of the thin film transistor is the drain, the second electrode is the source, and when the first electrode of the thin film transistor is the source, the second electrode is the drain.

The beneficial effects of the first embodiment lie in that, by being provided with a switching unit, a reset unit and a comparison unit, the detection circuit provided by the first embodiment can detect a representative quantity of the threshold voltage of the drive transistor and the working voltage of the light emitting element in a pixel circuit, thereby can detect non-uniformity of display brightness of pixels inside an active matrix organic electroluminescence display device. In turn, an external compensation circuit is enabled to well compensate the display brightness of pixels according to the detection result, such that the uniformity of display and hence the display effect of the active matrix organic electroluminescence display device is improved.

Second Embodiment

Based on the circuit structure of the detection circuit provided in the first embodiment, this embodiment provides a detection method for detecting a representative quantity of a to-be-detected threshold voltage of a drive transistor and a to-be-detected working voltage of a light emitting element in a pixel circuit. The detection method comprises the following steps.

At step S11, the switching unit switches to cause the reset unit to operate.

At step S12, the reset unit resets the acquisition unit before the acquisition unit begins acquisition.

At step S13, the acquisition unit acquires a to-be-detected voltage (i.e., the representative quantity of the threshold voltage of the drive transistor or the working voltage of the light emitting element).

At step S14, the switching unit switches to cause the comparison unit to operate.

At step S15, the acquisition unit acquires the representative quantity of the threshold voltage of the drive transistor and the working voltage of the light emitting element, and the comparison unit compares a signal acquired by the acquisition unit with a standard signal to obtain a characterization quantity of the to-be-detected voltage (i.e., the representative quantity of the threshold voltage of the drive transistor or the working voltage of the light emitting element).

Figure 5:
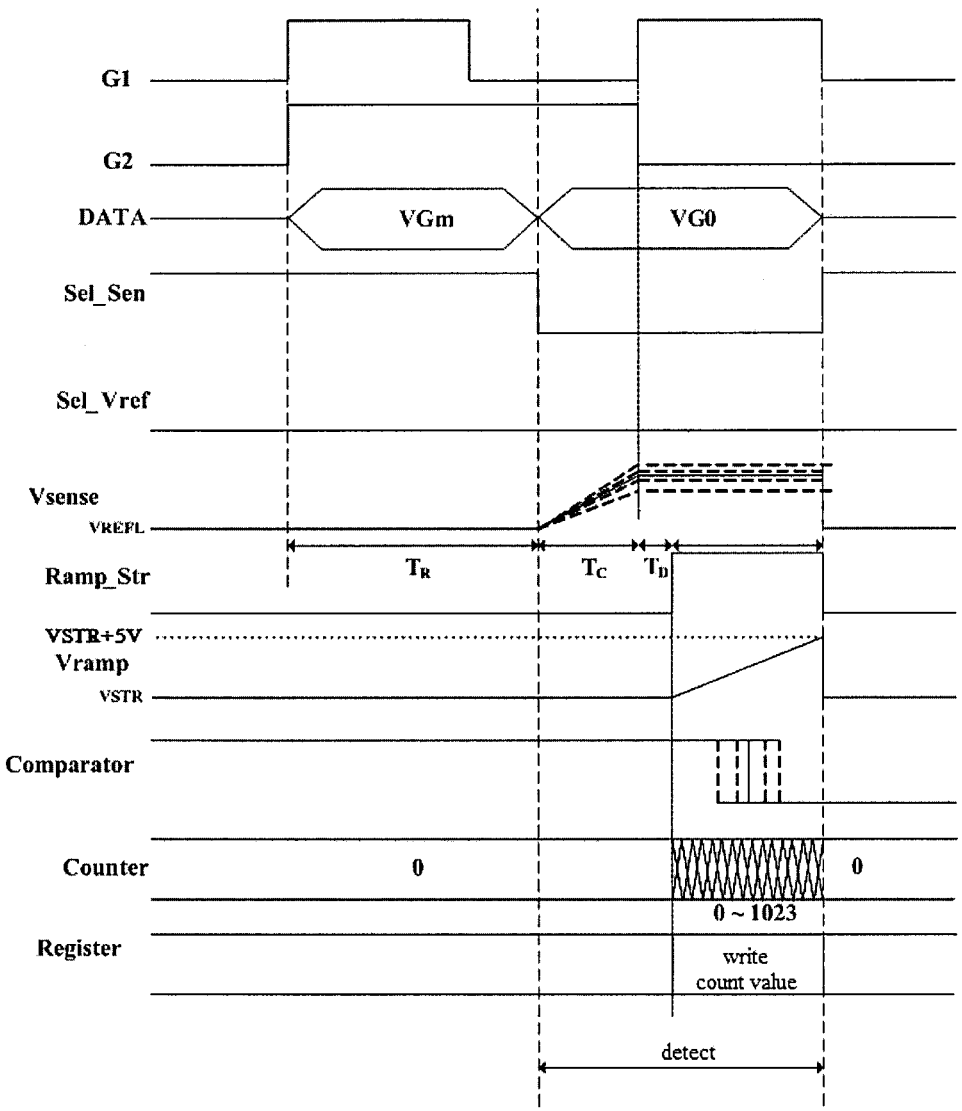
FIG. 5 is a timing diagram of the detection circuit in FIG. 2 when detecting a representative quantity of a threshold voltage of a drive transistor.

In the following, the operations of the detection method when the representative quantity of the threshold voltage of the drive transistor is to be detected will be described in detail in connection with the timing as shown in FIG. 5.

The step S11 specifically comprises: inputting, via the second control line Sel_sen, a control signal to turn on the second transistor, the fifth transistor and the seventh transistor; and at the same time to turn off the third transistor, the fourth transistor and the sixth transistor.

In the case of the circuit as shown in FIG. 2, a high level control signal is inputted via the second control line Sel_sen.

The step S12 specifically comprises: inputting, via the third control line Sel_vref, a control signal to turn on the eighth transistor and at the same time to turn off the ninth transistor; and inputting, via the first signal line VREFL, a low voltage signal to reset a signal Vsense on the acquisition line to the low voltage signal.

In the case of the circuit as shown in FIG. 2, a low level control signal is inputted via the third control line Sel_vref. The comparison amplifier comp is used to output a low voltage signal for resetting the acquisition line.

In this embodiment, as shown in FIG. 2, the pixel circuit further comprises a thirteenth transistor T13 and a storage capacitor C2. A first electrode of the thirteenth transistor T13 is connected with a data line DATA. A second electrode of the thirteenth transistor T13 is connected with a first terminal of the storage capacitor C2 and a gate of the drive transistor Q. A gate of the thirteenth transistor T13 is connected with a scan control line G1. The first electrode of the drive transistor Q is connected with a first power supply ELVDD. A second electrode of the light emitting element D is connected with a second power supply ELVSS. A second terminal of the storage capacitor C2 is connected with the second electrode of the drive transistor Q, the first electrode of the light emitting element D and the first electrode of the first transistor T1. The second electrode of the first transistor T1 is connected with the acquisition line Sense, and the gate of the first transistor T1 is connected with the first control line G2.

The step S13 specifically comprises the following steps.

At step S130, a control signal is inputted via the scan control line G1 to turn on the thirteenth transistor, such that a first voltage signal VGm is written via the data line DATA to cause a voltage difference across the storage capacitor C2 to be greater than the threshold voltage of the drive transistor Q.

In the case of the circuit as shown in FIG. 2, a high level control signal is inputted via the scan control line G1. The duration of this step is $T_R$.

At step S131, a control signal is inputted via the scan control line G1 to turn off the thirteenth transistor T13, and the first control line G2 controls the first transistor T1 to be turned on to causing charging of a line capacitance C_sense of the acquisition line by a current of the drive transistor Q.

In the case of the circuit as shown in FIG. 2, a low level control signal is inputted via the scan control line G1, and a high level control signal is inputted via the first control line G2. At this point, the voltage Vsense on the acquisition line will rise linearly. The duration of the charging is $T_C$. In particular, the duration $T_C$ of the charging is long enough to increase the voltage Vsense on the acquisition line, such that the gate-source voltage of the drive transistor Q is equal to the threshold voltage of the drive transistor Q. At this point, the voltage Vsense on the acquisition line is related with the threshold voltage. In other words, the voltage Vsense may represent the threshold voltage of the drive transistor Q. It should be appreciated that for the purpose of detecting the non-uniformity of the threshold voltages of OLED drive transistors in different pixel cells, it is appropriate to detect representative values of threshold voltages of drive transistors in different pixel cells instead of their actual values, with other conditions (for example, the first voltage signal VGm supplied from the data line DATA, the duration $T_C$ of the charging, etc.) being the same.

At step S132, when the charging is conducted to a point where a gate-source voltage of the drive transistor Q is the threshold voltage of the drive transistor, the thirteenth transistor T13 is turned on, and a second voltage signal VG0 is written via the data line DATA to turn off the drive transistor.

In the case of the circuit as shown in FIG. 2, the second voltage signal VG0 written via the data line DATA is 0 V. After the drive transistor is turned off, the voltage Vsense on the acquisition line remains to be the representative value of the threshold voltage of the drive transistor Q.

The step S14 specifically comprises: inputting, via the second control line Sel_sen, a control signal to turn on the third transistor T3, the fourth transistor T4 and the sixth transistor T6, and at the same time to turn off the second transistor T2, the fifth transistor T5 and the seventh transistor T7.

In the case of the circuit as shown in FIG. 2, a low level control signal is inputted via the second control line Sel_sen.

The step S15 specifically comprises the following steps.

At step S150, the ramp voltage generator module generates and outputs the standard signal, which is a ramp voltage signal Vramp, and the comparison amplifier comp compares the representative value of the threshold voltage of the drive transistor Q on the acquisition line with the ramp voltage Vramp outputted by the ramp voltage generator module and outputs a comparison result denoted as "Comparator".

The time interval from the drive transistor Q being turned off at the step S132 to the ramp voltage generator module beginning to output a ramp voltage at the step S150 is $T_D$. In this step, the comparison amplifier comp is used as a comparator. The ramp voltage signal Vramp is a linearly rising ramp voltage. When the voltage Vsense on the acquisition line (namely, the representative quantity of the threshold voltage of the drive transistor Q) is greater than the ramp voltage Vramp, the comparison amplifier comp outputs a high level. When the voltage Vsense on the acquisition line (namely, the representative quantity of the threshold voltage of the drive transistor) is less than the ramp voltage Vramp, the comparison amplifier comp outputs a low level.

At this step, the procedure of the ramp voltage generator module generating and outputting the standard signal is as follows: first, closing the control switch Ramp_Str to reset the first capacitor C1, such that on both terminals of the first capacitor C1 is a signal inputted via the third signal line VSTR; then, turning off the control switch Ramp_Str, such that the first capacitor C1 is charged by the current source L to obtain the ramp voltage Vramp. In particular, at this step, possible voltage deviations VOS1 and VOS2 in the ramp voltage generator module are not taken into account.

At step S151, when the comparison result outputted by the comparison amplifier comp changes, the logic controller records a corresponding count value of the counter at the instant when the comparison result changes, and outputs the count value. The count value characterizes the representative quantity of the threshold voltage of the drive transistor Q.

At this step, since the ramp voltage Vramp is formed by a current source L charging the first capacitor C1, the ramp voltage Vramp is directly proportional to the charging time. When the ramp voltage Vramp begins to rise, the 10-bit counter begins timing. When the comparison result of the comparison amplifier comp changes from high to low, the count value of the counter is stored into a register denoted as "Register". The count value characterizes the representative quantity of the threshold voltage of the drive transistor Q.

So far, the detection of the representative quantity of the threshold voltage of the drive transistor is finished.

Figure 6:
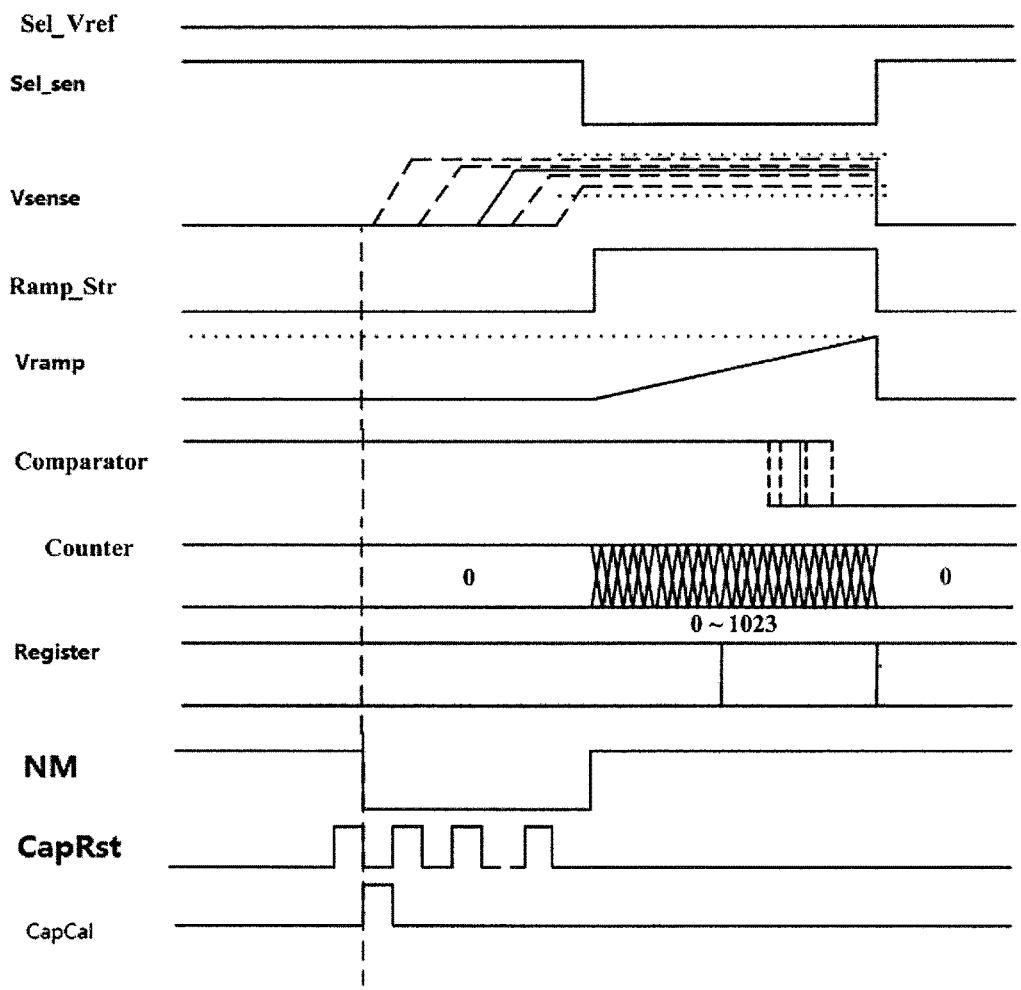
FIG. 6 is a timing diagram of the detection circuit in FIG. 3 when calibrating a line capacitance of an acquisition line.

In this embodiment, the detection method further comprises a step S10 of calibrating the line capacitance C_sense of the acquisition line prior to the step S11. In the following, the operations of the calibration step S10 will be described in detail in connection with the timing as shown in FIG. 6. The step S10 comprises the following steps.

At step S100, a control signal is inputted via the fifth control line NM to turn on the eleventh transistor T11, a control signal is inputted via the second control line Sel_sen to turn on the second transistor T2, the fifth transistor T5 and the seventh transistor T7, a control signal is inputted via the third control line Sel_vref to turn on the eighth transistor T8, a low voltage signal is inputted via the first signal line VREFL, and the signal Vsense on the acquisition line is reset to the low voltage signal. At the same time, a control signal is inputted via the sixth control line CapRst to turn on the twelfth transistor T12, a high voltage signal is inputted via the second signal line VREFH, and the signal on the calibration capacitor C_ext is reset to the high voltage signal.

In the case of the circuit as shown in FIG. 3, a high level control signal is inputted via the fifth control line NM, a high level control signal is inputted via the second control line Sel_sen, a low level control signal is inputted via the third control line Sel_vref, and a high level control signal is inputted via the sixth control line CapRst.

At step S101, the eleventh transistor T11 and the twelfth transistor T12 are turned off, a control signal is inputted via the fourth control line CapCal to turn on the tenth transistor T10, and the calibration capacitor C_ext shares charges with the line capacitance C_sense of the acquisition line. Thus, the line capacitance C_sense of the acquisition line is calibrated before acquisition, and the accuracy of the representative quantity of the threshold voltage of the drive transistor acquired by the acquisition line is improved.

In the case of the circuit as shown in FIG. 3, a low level control signal is inputted via the fifth control line NM, a low level control signal is inputted via the sixth control line CapRst, and a high level control signal is inputted via the fourth control line CapCal.

In addition, in this embodiment, the detection method further comprises: prior to the step S10, calibrating a voltage deviation between the positive input terminal and the negative input terminal of each of the first amplifier OP1 and the second amplifier OP2 in the ramp voltage generator module.

The calibration specifically comprises: causing the second amplifier OP2 to operate as a comparator; closing the control switch Ramp_Str, such that the current source L does not charge the first capacitor C1; inputting, via the third signal line VSTR, a third voltage signal; and calibrating automatically the voltage deviation between the positive input terminal and the negative input terminal of each of the first amplifier OP1 and the second amplifier OP2 by changing a voltage value of the calibration voltage source Vtrim until an output voltage Ramp_out of the second amplifier OP2 changes from a high voltage to a low voltage or from a low voltage to a high voltage.

Figure 7:
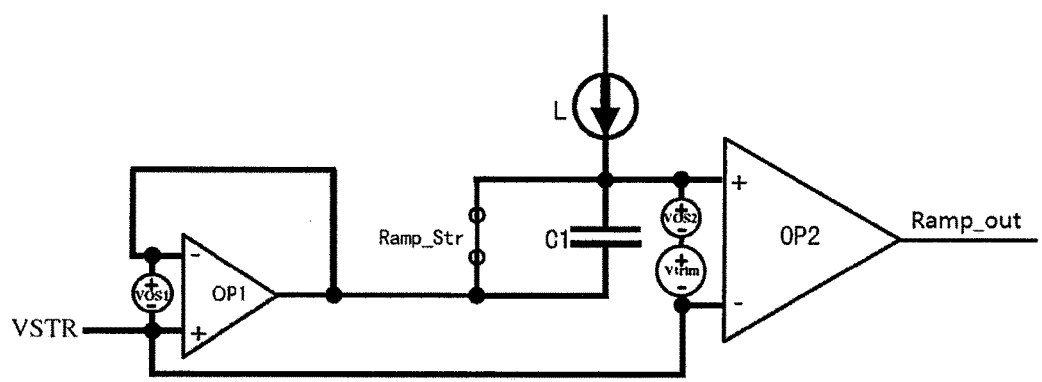
FIG. 7 is an equivalent circuit diagram of a ramp voltage generator module in FIG. 2 when in calibration.

In particular, in the calibration procedure, a voltage deviation VOS1 is present between the positive input terminal and the negative input terminal of the first amplifier OP1, and a voltage deviation VOS2 is present between the positive input terminal and the negative input terminal of the second amplifier OP2. As described previously, the second amplifier OP2 may be used as an amplifier and alternatively a comparator. When the second amplifier OP2 operates as an amplifier (as shown in FIG. 4), the control switch Ramp_Str is closed, and then the output signal of the ramp voltage generator module Ramp_out=VSTR+VOS1−(VOS2+Vtrim). The desired result of the calibration is to eliminate the effects of the voltage deviations VOS1 and VOS2, such that the output signal Ramp_out of the ramp voltage generator module is equal to the inputted third voltage signal VSTR, that is, VOS1−(VOS2+Vtrim)=0. In calibration, the control switch Ramp_Str is closed, and the second amplifier OP2 is made to operate as a comparator. At this point, the equivalent circuit of the ramp voltage generator module is as shown in FIG. 7. The positive input terminal of the first amplifier OP1 is connected with the negative input terminal of the second amplifier OP2, and the calibration voltage source Vtrim is connected between the positive input terminal and the negative input terminal of the second amplifier OP2. When VOS1−(VOS2+Vtrim) is positive, the output signal Ramp_out is a high level. When VOS1−(VOS2+Vtrim) is negative, the output signal Ramp_out is a low level. When the output signal Ramp_out changes from low to high or from high to low, the voltage deviation VOS1 between the positive and negative input terminals of the first amplifier OP1 and the voltage deviation VOS2 between the positive and negative input terminals of the second amplifier OP2 are exactly calibrated. Thus, the ramp voltage signal (i.e., the standard signal) generated and outputted by the ramp voltage generator module is made to be more accurate.

Figure 8:
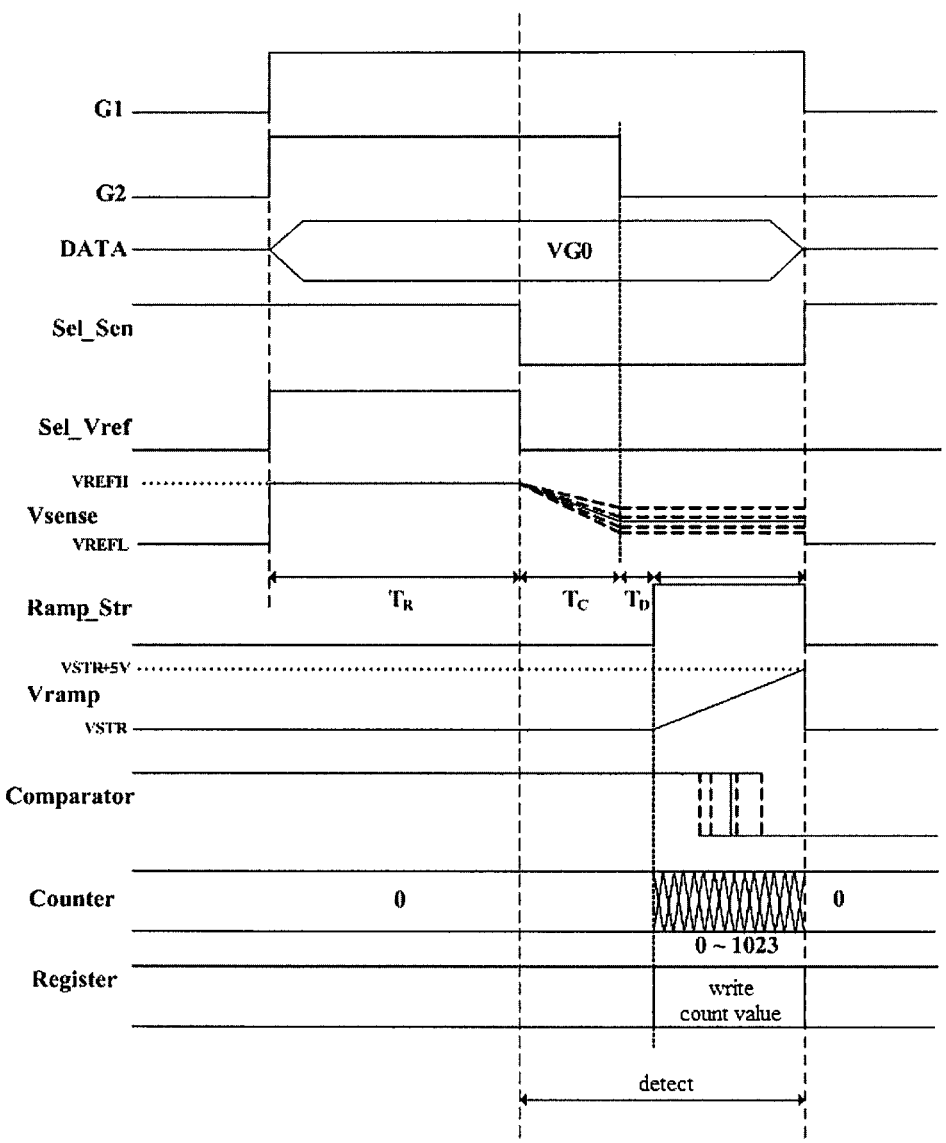
FIG. 8 is a timing diagram of the detection circuit in FIG. 2 when detecting a working voltage of a light emitting element.

In the following, the operations of the detection method when the working voltage of the light emitting element is to be detected will be described in detail in connection with the timing as shown in FIG. 8.

At step S11, the switching unit switches to cause the reset unit to operate. This step is exactly the same as when the representative quantity of the threshold voltage of the drive transistor is to be detected, and will not be repeated here.

The step S12 specifically comprises: inputting, via the third control line Sel_vref, a control signal to turn on the ninth transistor T9 and at the same time to turn off the eighth transistor T8; and inputting, via the second signal line VREFH, a high voltage signal to reset the signal Vsense on the acquisition line to the high voltage signal.

In the case of the circuit as shown in FIG. 3, a high level control signal is inputted via the third control line Sel_vref. The comparison amplifier comp is used to output a high voltage signal for resetting the acquisition line.

The step S13 specifically comprises the following steps.

At step S130', a control signal is inputted via the scan control line G1 to turn on the thirteenth transistor T13, and a second voltage signal VG0 is written via the data line DATA to turn off the drive transistor Q.

In the case of the circuit as shown in FIG. 3, a high level control signal is inputted via the scan control line G1. The duration of this step is $T_R$.

At step S131', the first control line G2 controls the first transistor T1 to be turned on to cause discharging of the charges stored on the acquisition line via the light emitting element.

In the case of the circuit as shown in FIG. 3, a high level control signal is inputted via the first control line G2. The high voltage signal Vsense reset on the acquisition line discharges via the light emitting element. In particular, the duration $T_C$ of the discharging is long enough to cause the voltage Vsense on the acquisition line to equal the working voltage (i.e., the threshold voltage) of the light emitting element.

At step S132', when the discharging is conducted to a point where the voltage Vsense on the acquisition line is the working voltage of the light emitting element, the first transistor T1 is turned off.

At this step, after the first transistor T1 is turned off, the acquisition line will not have the capability of outputting a voltage any longer. At this point, the voltage Vsense on the acquisition line remains to be the working voltage of the light emitting element.

At step S14, the switching unit switches to cause the comparison unit to operate. This step is exactly the same as when the representative quantity of the threshold voltage of the drive transistor is to be detected, and will not be repeated here.

The step S15 specifically comprises the following steps.

At step 150', the ramp voltage generator module generates and outputs the standard signal, which is a ramp voltage signal Vramp, and the comparison amplifier comp compares the working voltage of the light emitting element on the acquisition line with the ramp voltage Vramp outputted by the ramp voltage generator module and outputs a comparison result.

The time interval from the first transistor T1 being turned off at the step S132' to the ramp voltage generator module beginning to output a ramp voltage at the step S150' is $T_D$. At this step, the comparison amplifier comp is used as a comparator. The ramp voltage signal Vramp is a linearly rising ramp voltage. When the voltage Vsense on the acquisition line (namely, the working voltage of the light emitting element) is greater than the ramp voltage Vramp, the comparison amplifier comp outputs a high level. When the voltage Vsense on the acquisition line (namely, the working voltage of the light emitting element) is less than the ramp voltage Vramp, the comparison amplifier outputs a low level.

At step S151', when the comparison result outputted by the comparison amplifier comp changes, the logic controller records a corresponding count value of the counter at the instant when the comparison result changes, and outputs the count value. The count value characterizes the working voltage of the light emitting element.

At this step, since the ramp voltage Vramp is formed by a current source charging the first capacitor C1, the ramp voltage Vramp is directly proportional to the charging time. When the ramp voltage Vramp begins to rise, the 10-bit counter begins timing, and when the comparison result of the comparison amplifier comp changes from high to low, the count value of the counter is stored in a register. The count value characterizes the working voltage of the light emitting element.

So far, the detection of the working voltage of the light emitting element is finished.

When detecting the working voltage of the light emitting element, both the step of calibrating the line capacitance C_sense of the acquisition line and the step of calibrating the voltage deviation between the positive input terminal and the negative input terminal of each of the first amplifier OP1 and the second amplifier OP2 in the ramp voltage generator module are exactly the same as when detecting the representative quantity of the threshold voltage of the drive transistor, and will not be repeated here.

It is to be noted that the detection method may also be used to detect only the representative quantity of the threshold voltage of the drive transistor or the working voltage of the light emitting element.

Third Embodiment

This embodiment provides a drive system for driving a pixel circuit, which comprises a detection circuit in the first embodiment.

Referring back to FIG. 2 or FIG. 3, the drive system may further comprise a drive circuit comprising: a latch denoted as "Latch", a line storage LS, a digital-to-analog converter DAC and a third amplifier OP.

The latch is used for latching display data SD. The line storage is connected to the latch and used for receiving display data SD from the latch and storing display data for a row of pixel cells. The digital-to-analog converter is connected to the line storage and used for converting corresponding display data in the line storage to an analog voltage signal. The third amplifier is used for supplying the analog voltage signal converted by the digital-to-analog converter to the data line DATA of a corresponding pixel cell. The positive input terminal of the third amplifier is connected with the output terminal of the digital-to-analog converter, and the negative input terminal of the third amplifier is connected with the output terminal of the third amplifier and the data line.

By employing the detection circuit in the first embodiment, the drive system can not only drive a pixel circuit, but also detect non-uniformity of display brightness of pixels inside an active matrix organic electroluminescence display device. In turn, an external compensation circuit is enabled to well compensate the display brightness of pixels according to the detection result, such that the uniformity of display and hence the display effect of the active matrix organic electroluminescence display device is improved.

It will be appreciated that the above embodiments are only exemplary embodiments used for illustrating the principles of the disclosure. However, the disclosure is not so limited. For those of ordinary skills in the art, various variations and improvements may be made without departing from the spirit and essence of the disclosure, and these variations and improvements are also construed as falling with the scope of the disclosure.

The invention claimed is:

1. A detection circuit for a pixel circuit, the pixel circuit comprising a drive transistor having a first electrode, a light emitting element having a first electrode connected to the first electrode of the drive transistor, and an acquisition unit connected with the drive transistor and the light emitting element, the acquisition unit comprising a first transistor having a first electrode connected to the first electrode of the drive transistor and the first electrode of the light emitting element, a second electrode connected to an acquisition line, and a gate connected to a first control line, the acquisition line being configured to acquire a to-be-detected voltage under control of the first transistor, the to-be-detected voltage being a representative quantity of a threshold voltage of the drive transistor or a working voltage of the light emitting element, the detection circuit comprising:

a reset unit for resetting the acquisition unit before the acquisition unit begins acquisition;

a comparison unit for comparing the to-be-detected voltage acquired by the acquisition unit with a standard signal to obtain a characterization quantity of the to-be-detected voltage; and a switching unit for switching operations of the reset unit and the comparison unit;

wherein the reset unit and the comparison unit are connected with the switching unit and the switching unit is connected with the acquisition unit, and wherein the switching unit comprises a second transistor, a third transistor, a fourth transistor, a fifth transistor, a sixth transistor and a seventh transistor, wherein:

a first electrode of the second transistor and a first electrode of the fourth transistor are connected with the acquisition line, a second electrode of the second transistor, a first electrode of the third transistor and a first electrode of the seventh transistor are connected with the comparison unit, a second electrode of the third transistor is connected with the comparison unit, a second electrode of the fourth transistor and a first electrode of the fifth transistor are connected with the comparison unit, a second electrode of the fifth transistor is connected with the reset unit, a first electrode of the sixth transistor and a second electrode of the seventh transistor are connected with the comparison unit, and a second electrode of the sixth transistor is connected with the comparison unit.

2. The detection circuit as claimed in claim 1, wherein the reset unit comprises an eighth transistor and a ninth transistor, a first electrode of the eighth transistor and a first electrode of the ninth transistor connected with a second electrode of the fifth transistor, a second electrode of the eighth transistor connected with a first signal line, a second electrode of the ninth transistor connected with a second signal line.

3. The detection circuit as claimed in claim 2, wherein the second transistor, the fifth transistor, the seventh transistor and the ninth transistor are N-type transistors, and the third transistor, the fourth transistor, the sixth transistor and the eighth transistor are P-type transistors; or
wherein the second transistor, the fifth transistor, the seventh transistor and the ninth transistor are P-type transistors, and the third transistor, the fourth transistor, the sixth transistor and the eighth transistor are N-type transistors.

4. The detection circuit as claimed in claim 3, wherein gates of the second transistor, the third transistor, the fourth transistor, the fifth transistor, the sixth transistor and the seventh transistor are connected with a second control line, and gates of the eighth transistor and the ninth transistor are connected with a third control line.

5. The detection circuit as claimed in claim 4, wherein the comparison unit comprises a comparison amplifier, a ramp voltage generator module and an output module, a first input terminal of the comparison amplifier connected with the second electrode of the fourth transistor and the first electrode of the fifth transistor, a second input terminal of the comparison amplifier connected with the first electrode of the sixth transistor and the second electrode of the seventh transistor, an output terminal of the comparison amplifier connected with the second electrode of the second transistor, the first electrode of the third transistor and the first electrode of the seventh transistor, an output terminal of the ramp voltage generator module connected with the second electrode of the sixth transistor, an input terminal of the ramp voltage generator module connected with a third signal line, an input terminal of the output module connected with the second electrode of the third transistor,
wherein the ramp voltage generator module is configured to generate and output the standard signal, the standard signal being a ramp voltage signal;
wherein the comparison amplifier is configured to compare the to-be-detected voltage acquired by the acquisition line with the ramp voltage outputted by the ramp voltage generator module and output a comparison result; and
wherein an output terminal of the output module is configured to output a detection result of the detection circuit according to the comparison result of the comparison amplifier.

6. The detection circuit as claimed in claim 5, wherein the ramp voltage generator module comprises a first amplifier, a second amplifier, a current source, a first capacitor and a control switch, a positive input terminal of the first amplifier connected with the third signal line, a negative input terminal of the first amplifier, an output terminal of the first amplifier and a first terminal of the control switch connected with a first terminal of the first capacitor, a positive input terminal of the second amplifier, a second terminal of the first capacitor and a second terminal of the control switch connected with an output terminal of the current source, a negative input terminal of the second amplifier connected with an output terminal of the second amplifier, the output terminal of the second amplifier connected with the second electrode of the sixth transistor.

7. The detection circuit as claimed in claim 6, wherein the ramp voltage generator module further comprises a calibration voltage source, an anode of the calibration voltage source connected with the positive input terminal of the second amplifier, a cathode of the calibration voltage source connected with the negative input terminal of the second amplifier, and
wherein the calibration voltage source is configured to calibrate a voltage deviation between the positive input terminal and the negative input terminal of the first amplifier and a voltage deviation between the positive input terminal and the negative input terminal of the second amplifier.

8. The detection circuit as claimed in claim 5, wherein the output module comprises a logic controller and a counter, an input terminal of the logic controller connected with the second electrode of the third transistor, a control terminal of the logic controller connected with the counter, and
wherein the logic controller is configured to, according to the comparison result outputted by the comparison amplifier, record a corresponding count value of the counter upon a change of the comparison result, and to output the count value, the count value characterizing the to-be-detected voltage.

9. The detection circuit as claimed in claim 5, further comprising a capacitance calibration unit for calibrating a line capacitance of the acquisition line, the capacitance calibration unit comprising a tenth transistor, an eleventh transistor, a twelfth transistor and a calibration capacitor, a first electrode of the tenth transistor and a first electrode of the eleventh transistor connected with the acquisition line, a second electrode of the tenth transistor and a first terminal of the calibration capacitor connected with a first electrode of the twelfth transistor, a second terminal of the calibration capacitor being grounded, a gate of the tenth transistor connected with a fourth control line, a second electrode of the eleventh transistor and the first electrode of the second transistor connected with the first electrode of the fourth transistor, a gate of the eleventh transistor connected with a fifth control line, a second electrode of the twelfth transistor connected with the second signal line, a gate of the twelfth transistor connected with a sixth control line.

10. A drive system for driving a pixel circuit, comprising the detection circuit as claimed in claim 1.

11. A method of using a detection circuit for a pixel circuit, the pixel circuit comprising a drive transistor having a first electrode, a light emitting element having a first electrode connected to the first electrode of the drive transistor, and an acquisition unit connected with the drive transistor and the light emitting element, the acquisition unit comprising a first transistor having a first electrode connected to the first electrode of the drive transistor and the first electrode of the light emitting element, a second electrode connected to an acquisition line, and a gate connected to a first control line, the acquisition line being configured to acquire a to-be-detected voltage under control of the first transistor, the to-be-detected voltage being a representative quantity of a threshold voltage of the drive transistor or a working voltage of the light emitting element, the detection circuit comprising a switching unit, a reset unit and a comparison unit, the reset unit and the comparison unit being connected with the switching unit, the switching unit being connected with the acquisition unit, the switching unit comprising a second transistor, a third transistor, a fourth transistor, a fifth transistor, a sixth transistor and a seventh transistor, a first electrode of the second transistor and a first electrode of the fourth transistor being connected with the acquisition line, a second electrode of the second transistor, a first electrode of the third transistor and a first electrode of the seventh transistor being connected with the comparison unit, a second electrode of the third transistor being connected with the comparison unit, a second electrode of the fourth transistor and a first electrode of the fifth transistor being connected with the comparison unit, a second electrode of the fifth transistor being connected with the reset unit, a first electrode of the sixth transistor and a second electrode of the seventh transistor being connected with the comparison unit, a second electrode of the sixth transistor being connected with the comparison unit, the method comprising steps of:

causing the reset unit to operate by switching the switching unit;

resetting, by the reset unit, the acquisition unit before the acquisition unit begins acquisition;

acquiring, by the acquisition unit, the to-be-detected voltage;

causing the comparison unit to operate by switching the switching unit; and comparing, by the comparison unit, the acquired to-be-detected voltage by the acquisition unit with a standard signal to obtain a characterization quantity of the to-be-detected voltage.

12. The method as claimed in claim 11, wherein gates of the second transistor, the third transistor, the fourth transistor, the fifth transistor, the sixth transistor and the seventh transistor are connected with a second control line; and wherein the step of causing the reset unit to operate by switching the switching unit comprises: inputting, via the second control line, a control signal to turn on the second transistor, the fifth transistor and the seventh transistor, and at the same time to turn off the third transistor, the fourth transistor and the sixth transistor.

13. The method as claimed in claim 12, wherein the reset unit comprises an eighth transistor and a ninth transistor, a first electrode of the eighth transistor and a first electrode of the ninth transistor connected with the second electrode of the fifth transistor, a second electrode of the eighth transistor connected with a first signal line, a second electrode of the ninth transistor connected with a second signal line;

wherein the ninth transistor is an N-type transistor and the eighth transistor is a P-type transistor; or wherein the ninth transistor is a P-type transistor and the eighth transistor is an N-type transistor;

wherein gates of the eighth transistor and the ninth transistor are connected with a third control line;

wherein when the representative quantity of the threshold voltage of the drive transistor is to be detected, the step of resetting the acquisition unit before the acquisition unit begins acquisition comprises:

inputting, via the third control line, a control signal to turn on the eighth transistor and at the same time to turn off the ninth transistor; and inputting, via the first signal line, a low voltage signal to reset a signal on the acquisition line to the low voltage signal; and wherein when the working voltage of the light emitting element is to be detected, the step of resetting the acquisition unit before the acquisition unit begins acquisition comprises:

inputting, via the third control line, a control signal to turn on the ninth transistor and at the same time to turn off the eighth transistor; and inputting, via the second signal line, a high voltage signal to reset a signal on the acquisition line to the high voltage signal.

14. The method as claimed in claim 13, wherein the pixel circuit further comprises a thirteenth transistor and a storage capacitor, a first electrode of the thirteenth transistor connected with a data line, a second electrode of the thirteenth transistor connected with a first terminal of the storage capacitor and a gate of the drive transistor, a gate of the thirteenth transistor connected with a scan control line, the first electrode of the drive transistor connected with a first power supply, a second electrode of the light emitting element connected with a second power supply, a second terminal of the storage capacitor connected with the second electrode of the drive transistor, the first electrode of the light emitting element and the first electrode of the first transistor, the second electrode of the first transistor connected with the acquisition line, the gate of the first transistor connected with the first control line;

wherein when the representative quantity of the threshold voltage of the drive transistor is to be detected, the step of acquiring a to-be-detected voltage comprises:

inputting, via the scan control line, a control signal to turn on the thirteenth transistor, such that a first voltage signal is written via the data line to cause a voltage difference across the storage capacitor to be greater than the threshold voltage of the drive transistor;

inputting, via the scan control line, a control signal to turn off the thirteenth transistor;

controlling, by the first control line, the first transistor to be turned on to cause charging of a line capacitance of the acquisition line by a current of the drive transistor;

in response to the charging being conducted to a point where a gate-source voltage of the drive transistor is the threshold voltage of the drive transistor, turning on the thirteenth transistor, such that a second voltage signal is written via the data line to turn off the drive transistor; and wherein when the working voltage of the light emitting element is to be detected, the step of acquiring a to-be-detected voltage comprises:

inputting, via the scan control line, a control signal to turn on the thirteenth transistor, such that the second voltage signal is written via the data line to turn off the drive transistor;

controlling, by the first control line, the first transistor to be turned on to cause discharging of charges stored on the acquisition line via the light emitting element; and in response to the discharging being conducted to a point where a voltage on the acquisition line is the working voltage of the light emitting element, turning off the first transistor.

15. The method as claimed in claim 14, wherein the step of causing the comparison unit to operate by switching the switching unit comprises: inputting, via the second control line, a control signal to turn on the third transistor, the fourth transistor and the sixth transistor, and at the same time to turn off the second transistor, the fifth transistor and the seventh transistor.

16. The method as claimed in claim 15, wherein the comparison unit comprises a comparison amplifier, a ramp voltage generator module and an output module, a first input terminal of the comparison amplifier connected with the second electrode of the fourth transistor and the first electrode of the fifth transistor, a second input terminal of the comparison amplifier connected with the first electrode of the sixth transistor and the second electrode of the seventh transistor, an output terminal of the comparison amplifier connected with the second electrode of the second transistor, the first electrode of the third transistor and the first electrode of the seventh transistor, an output terminal of the ramp voltage generator module connected with the second electrode of the sixth transistor, an input terminal of the ramp voltage generator module connected with a third signal line, an input terminal of the output module connected with the second electrode of the third transistor;
  wherein the output module comprises a logic controller and a counter, an input terminal of the logic controller connected with the second electrode of the third transistor, a control terminal of the logic controller connected with the counter;
  wherein when the representative quantity of the threshold voltage of the drive transistor is to be detected, the step of comparing comprises:
  generating and outputting, by the ramp voltage generator module, the standard signal, the standard signal being a ramp voltage signal;
  comparing, by the comparison amplifier, the representative quantity of the threshold voltage of the drive transistor on the acquisition line with the ramp voltage outputted by the ramp voltage generator module; and
  upon a change of a comparison result outputted by the comparison amplifier, recording, by the logic controller, a corresponding count value of the counter, the count value characterizing the representative quantity of the threshold voltage of the drive transistor; and
  wherein when the working voltage of the light emitting element is to be detected, the step of comparing comprises:
  generating and outputting, by the ramp voltage generator module, the standard signal, the standard signal being a ramp voltage signal;
  comparing, by the comparison amplifier, the working voltage of the light emitting element on the acquisition line with the ramp voltage outputted by the ramp voltage generator module; and
  upon a change of a comparison result outputted by the comparison amplifier, recording, by the logic controller, a corresponding count value of the counter, the count value characterizing the working voltage of the light emitting element.

17. The method as claimed in claim 16, wherein the detection circuit further comprises a capacitance calibration unit, the capacitance calibration unit comprising a tenth transistor, an eleventh transistor, a twelfth transistor and a calibration capacitor, a first electrode of the tenth transistor and a first electrode of the eleventh transistor connected with the acquisition line, a second electrode of the tenth transistor and a first terminal of the calibration capacitor connected with a first electrode of the twelfth transistor, a second terminal of the calibration capacitor being grounded, a gate of the tenth transistor connected with a fourth control line, a second electrode of the eleventh transistor and the first electrode of the second transistor connected with the first electrode of the fourth transistor, a gate of the eleventh transistor connected with a fifth control line, a second electrode of the twelfth transistor connected with the second signal line, a gate of the twelfth transistor connected with a sixth control line; and
  wherein the method further comprises a step of calibrating the line capacitance of the acquisition line prior to the step of causing the reset unit to operate by switching the switching unit, the step of calibrating the line capacitance of the acquisition line comprising:
  inputting, via the fifth control line, a control signal to turn on the eleventh transistor;
  inputting, via the second control line, a control signal to turn on the second transistor, the fifth transistor and the seventh transistor;
  inputting, via the third control line, a control signal to turn on the eighth transistor;
  inputting, via the first signal line, a low voltage signal to reset a signal on the acquisition line to the low voltage signal;
  inputting, via the sixth control line, a control signal to turn on the twelfth transistor;
  inputting, via the second signal line, a high voltage signal to reset a signal on the calibration capacitor to the high voltage signal;
  turning off the eleventh transistor and the twelfth transistor;
  inputting, via the fourth control line, a control signal to turn on the tenth transistor; and
  sharing, by the calibration capacitor, charges with the line capacitance of the acquisition line.

18. The method as claimed in claim 17, wherein the ramp voltage generator module comprises a first amplifier, a second amplifier, a current source, a first capacitor and a control switch, a positive input terminal of the first amplifier connected with the third signal line, a negative input terminal of the first amplifier, an output terminal of the first amplifier and a first terminal of the control switch connected with a first terminal of the first capacitor, a positive input terminal of the second amplifier, a second terminal of the first capacitor and a second terminal of the control switch connected with an output terminal of the current source, the output terminal of the second amplifier connected with the second electrode of the sixth transistor;
  wherein when the second amplifier operates as an amplifier, a negative input terminal of the second amplifier is connected with an output terminal of the second amplifier, and when the second amplifier operates as a comparator, the negative input terminal of the second amplifier is connected with the positive input terminal of the first amplifier;
  wherein the ramp voltage generator module further comprises a calibration voltage source, an anode of the calibration voltage source connected with the positive input terminal of the second amplifier, a cathode of the calibration voltage source connected with the negative input terminal of the second amplifier; and
  wherein the method further comprises: prior to the step of calibrating the line capacitance of the acquisition line, calibrating a voltage deviation between the positive input terminal and the negative input terminal of each of the first amplifier and the second amplifier in the ramp voltage generator module, comprising:
  causing the second amplifier to operate as a comparator;
  closing the control switch, such that the current source does not charge the first capacitor;
  inputting, via the third signal line, a third voltage signal; and
  calibrating automatically the voltage deviation between the positive input terminal and the negative input terminal of each of the first amplifier and the second amplifier by changing a voltage value of the calibration voltage source until an output voltage of the second amplifier changes from a high voltage to a low voltage or from a low voltage to a high voltage.

* * * * *